United States Patent [19]
Gordon et al.

[11] Patent Number: 6,037,003
[45] Date of Patent: Mar. 14, 2000

[54] CHEMICAL VAPOR DEPOSITION OF ALUMINUM OXIDE

[75] Inventors: Roy Gordon, Cambridge, Mass.; Keith Kramer, Cleveland, Ohio; Xinye Liu, Cambridge, Mass.

[73] Assignee: President and Fellows of Harvard College, Cambridge, Mass.

[21] Appl. No.: 09/284,526

[22] PCT Filed: Oct. 15, 1997

[86] PCT No.: PCT/US97/18576

§ 371 Date: Jun. 11, 1999

§ 102(e) Date: Jun. 11, 1999

[87] PCT Pub. No.: WO98/16667

PCT Pub. Date: Apr. 23, 1998

Related U.S. Application Data

[60] Provisional application No. 60/028,159, Oct. 16, 1996.

[51] Int. Cl.$^7$ .................................................. C23C 16/40
[52] U.S. Cl. ............................. 427/255.34; 427/255.19; 427/314; 427/255.31
[58] Field of Search .................. 427/255.34, 255.31, 427/255.19, 314

[56] References Cited

U.S. PATENT DOCUMENTS

| | | |
|---|---|---|
| 2,805,965 | 9/1957 | Robinson . |
| 2,972,555 | 2/1961 | Deutscher . |
| 5,098,857 | 3/1992 | Kuech et al. . |

FOREIGN PATENT DOCUMENTS

| | | |
|---|---|---|
| 3918932 A1 | 6/1989 | Germany . |
| WO 97/20963 | 6/1997 | WIPO . |
| WO 98/02444 | 1/1998 | WIPO . |
| WO 98/16667 | 4/1998 | WIPO . |

OTHER PUBLICATIONS

Goorsky et al., "Characterization of Epitaxial GaAs and $Al_xGa_{1-x}As$ Layers Doped with Oxygen" *Appl. Phys. Lett.* 58(18)1979–1981 (1991). No Month Data!.

Huang et al., "Alkoxide Precursors for Controlled Oxygen Incorporation during Metalorganic Vapor Phase Epitaxy GaAs and $Al_xGa_{1-x}As$ Growth" *J. Electronic Mater.* 23:659 (1994). No Month Data!.

Huang et al., "Oxygen–based Deep Levels in Metalorganic Vapor Phase Epitaxy Indium Gallium Arsenide" *Appl. Phys. Lett.* 67:1116–1118 (1995). No Month Data!.

Huang et al., "Multiple Deep Levels in Metalorganic Vapor Phase Epitaxy GaAs Grown by Controlled Oxygen Incorporation" *Appl. Phys. Lett.* 65(5):604–606 (1994). No Month Data!.

Rogers et al., "Dimethylaluminium Alkoxides: A Physico––Chemical Investigation" *J. Chem. Soc. Dalton Trans.*, 1:3179–3187 (1992). No Month Data!.

Saraie et al., "Chemical Vapor Deposition of Aluminum Oxide Thin Films Under Reduced Pressures" *J. Electrochem. Soc.* 132(4):890–2 (1985). No Month Data.

*Primary Examiner*—Roy V. King
*Attorney, Agent, or Firm*—Clark & Elbing LLP; Mary Rose Scozzafava

[57] ABSTRACT

An aluminum oxide film is deposited on a heated substrate by CVD from one or more alkylaluminum alkoxide compounds having composition $R_nAl_2(OR')_{6-n}$, wherein R and R' are alkyl groups and n is in the range of 1 to 5.

13 Claims, No Drawings

CHEMICAL VAPOR DEPOSITION OF ALUMINUM OXIDE

This application claims the benefit of U.S. Provisional Application No. 60/028,159, filed Oct. 16, 1996 and PCT International Application PCT/US97/18576, filed Oct. 15, 1997 wherein the United States was a designated country.

This invention was made with government support under Subcontract Number XAN-4-13318-05 under Prime Contract Number DE-AC02-83CH10093 awarded by the Midwest Research Institute, National Renewable Energy Laboratory Division. The United States government may have certain rights in this invention.

BACKGROUND OF THE INVENTION

Aluminum oxide is an electrical insulator and is transparent to visible light. It is a strong, hard material and resists attack by most chemicals. Aluminum oxide layers form good barriers against diffusion of many materials, such as sodium. Aluminum oxide may be formed by reactions of a wide variety of aluminum-containing compounds in processes called chemical vapor deposition (CVD), in which an aluminum-containing vapor reacts on a hot surface to deposit aluminum oxide.

CVD of aluminum oxide has been demonstrated from trialkylaluminum precursors, which have the general formula $AlR_3$, in which R stands for an organic radical, such as methyl, ethyl, isopropyl, etc. Trimethylaluminum and triethylaluminum are precursors in this class. If vapors of trimethylaluminum are mixed with low concentrations of oxygen near a heated surface, a layer of aluminum oxide is deposited. This process is described by K. M. Gustin and R. G. Gordon in the Journal of Electronic Materials, Volume 17, pages 509–517 in 1988. Aluminum alkyls have some disadvantages in a CVD process. Aluminum alkyls ignite spontaneously in air, so that they are a serious fire hazard. Larger amounts of oxygen in the CVD chamber cause powdered aluminum oxide to form, instead of films. Thus the CVD processes for forming aluminum oxide films from aluminum alkyls can be disrupted by air leaks into the CVD chamber.

Aluminum 2,4-pentanedionate (also known as aluminum acetylacetonate) is another precursor used for CVD of aluminum oxide. It has the advantage over the aluminum alkyls of not being pyrophoric, and in fact it is completely stable in the presence of air and water at ambient temperatures. Aluminum 2,4-pentanedionate may be vaporized from its melt in a bubbler at temperatures above its melting point of 189° C., the vapors mixed with dry oxygen gas, and passed over a heated substrate, in order to deposit films of aluminum oxide. This process is described by R. G. Gordon in U.S. Pat. No. 4,308,316 (1981). A disadvantage of using aluminum 2,4-pentanedionate is that it decomposes when the material is heated for several hours in a bubbler, so that successive deposition runs do not have the same vapor concentration or deposition rate.

Aluminum isopropoxide has also been used to deposit aluminum oxide films. See, for example, J. A. Aboaf in the Journal of the Electrochemical Society, volume 114, pages 948–952 (1967). This material exists in a number of isomeric forms, ranging from dimers to trimers to polymers of various lengths. The rates of interconversion between isomeric forms are slow, often taking days. The vapor pressures of these isomers vary widely. Thus it is very difficult to regulate or predict the vapor pressure of any particular sample of aluminum isopropoxide, and the deposition rate of aluminum oxide is not reproducible.

Aluminum 2-ethylhexanoate has been proposed as another source for CVD of aluminum oxide, by T. Maruyama and T. Nakai in Applied Physics Letters, volume 58, pages 2079–2080 (1991). This solid source material has a very low vapor pressure, which limits the deposition rate to low values.

These aluminum oxide precursors are all solids at room temperature, except for the aluminum alkyls, which are normally liquids. Solid materials are less convenient to handle and move into bubblers, than are liquid precursors. Another advantage of liquid precursors is that they may be vaporized by directly injecting a controlled flow of the liquid into a preheated carrier gas. This direct liquid injection method for vaporization is becoming increasingly widely used in CVD processes, because it allows very reproducible control of the vapor concentration, and minimizes or eliminates premature decomposition of the precursor materials. Thus another disadvantage of the solids, aluminum 2,4-pentanedionate, aluminum isopropoxide and aluminum 2-ethylhexanoate, is that they cannot be vaporized by the direct liquid injection method.

Dialkylaluminum alkoxides have been shown to dope crystalline III–V semiconductors such as GaAs with small amounts of oxygen (parts per million), by M. S. Goorsky, T. F. Kuech, F. Cardone, P. M. Mooney, G. J. Scilla and R. M. Potemski, Appi. Phys. Lett., vol. 58, pages 1979–1981 (1991); T. F. Kuech and M. A. Tischler, U.S. Pat. No. 5,098,857 (1992); J. W. Huang and T. F. Kuech, Appl. Phys. Lett., vol. 65, pages 604–606 (1994); J. W. Huang, D. F. Gaines, T. F. Kuech, R. M. Potemski and F. Cardone, J. Electronic Mater., vol. 23, p. 659 (1994); and J. W. Huang, T. F. Kuech and T. J. Anderson, Appl. Phys. Lett., vol. 67, pages 1116–1118 (1995). These references do not teach or suggest that alkylaluminum alkoxides could be used to deposit pure aluminum oxide films. In fact, the Appl. Phys. Lett., vol. 65 (1994) publication states that diethylaluminum ethoxide has a suitable vapor pressure for use as a dopant, which would lead a one to expect that it has a vapor pressure too low to act as a CVD source for a film of pure aluminum oxide. None of these references suggest that any alkylaluminum alkoxide could be homogeneously mixed with oxygen in a gas mixture for depositing aluminum oxide. In fact, the Appl. Phys. Lett., vol. 58, publication states that $O_2$ would not be incorporated readily in films grown under their conditions.

SUMMARY OF THE INVENTION

A principal object of the present invention is to provide a process for depositing aluminum oxide films having high purity, high electrical resistivity and high transparency to light.

Another object of the present invention is the deposition of aluminum oxide films from chemical precursors that are not pyrophoric.

Another object of the present invention is the deposition of aluminum oxide films from chemical precursors that are relatively non-viscous liquids at room temperature.

An additional object of the present invention is the deposition of aluminum oxide films from chemical precursors that are easily vaporized without decomposition, and do not leave a non-volatile residue.

A further object of the present invention is to deposit aluminum oxide from a robust chemical vapor deposition process which is not easily disrupted by leaks of air into the deposition region.

A related object is to deposit aluminum oxide by a chemical vapor deposition process in which all the reactant vapors may be mixed homogeneously before delivery to the surface of the substrate.

Another object of the invention is to provide a chemical vapor deposition process for aluminum oxide from reactants that are commercially available, stable and relatively non-hazardous.

Other objects of the invention will be obvious to those skilled in the art on reading the instant description of the invention.

Yet another object of the invention is to provide an efficient and economical process for the preparation of aluminum oxide films.

The above objects have been substantially achieved by a process for the chemical vapor deposition of aluminum oxide from vapors of an alkylaluminum alkoxide and, optionally, another oxygen-containing gas. The composition of the preferred alkyldialuminum alkoxides is $R_nAl_2(OR')_{6-n}$, where R and R' are alkyl groups and n is in the range of 1 to 5. Preferred compounds have n ranging from less than four to two, and more preferably n is about three. Because the preferred alkyldialuminum alkoxides used in the method of the invention are a mixture of alkoxide compounds, the average n is not required to be an integer. The relative proportion of alkyl and alkoxide groups and the particular species of R and R' are selected to provide a non-pyrophoric liquid.

An advantage of the alkyldialuminum alkoxides of the invention is that they are non-pyrophoric. This is in comparison to alkyldialuminum alkoxides having a higher alkyl content, such as when n is four or greater. By way of example, diethylaluminum ethoxide ($Et_2AlOEt$) is classified as pyrophoric and a flammable liquid. In contrast, the alkylaluminum alkoxides used in the method of the present invention meet the standards set out by the United States Department of Transportation for being classified as non-pyrophoric.

One preferred n=3 embodiment uses a homogeneous vapor mixture including triethyldialuminum tri-sec-butoxide, oxygen and, optionally, an inert carrier gas such as nitrogen. This vapor mixture is brought into contact with a substrate heated to a temperature in the range of about 300 to 500° C., most preferably about 350 to 450° C. Under these conditions, a transparent, electrically insulating film of aluminum oxide is deposited on the substrate. The process, run under these conditions, is appropriate for coating thermally sensitive substrates, such as cut pieces of glass which would lose their flatness if heated to higher temperatures, computer chips which would be damaged by higher temperatures, and metals such as aluminum, which softens and melts at higher temperatures.

Another preferred embodiment uses a homogeneous vapor mixture including triethyldialuminum tri-sec-butoxide and, optionally, an inert carrier gas such as nitrogen. This vapor mixture is brought into contact with a substrate heated to a temperature in the range of about 500 to 700° C., most preferably about 550 to 650° C. Under these conditions, a transparent, electrically insulating film of aluminum oxide is deposited on the substrate. These higher temperature conditions are appropriate for coating more thermally stable substrates, such as a glass ribbon in a float-glass production line, or high-melting materials, such as steel or ceramics. Suitable substrates include, but are not limited to, glass, quartz, silicon, gallium arsenide, metals, ceramics and the like.

DETAILED DESCRIPTION OF THE INVENTION

The process of the invention can be carried out in standard equipment well known in the art of chemical vapor deposition. The apparatus brings the vapors of the reactants into contact with a heated substrate on which the aluminum oxide deposits. The process can operate at a variety of pressures, including in particular normal atmospheric pressure, and also lower pressures. Commercial atmospheric pressure CVD furnaces are made in the USA by the Watkins-Johnson Company (Scotts Valley, Calif.), BTU International (North Billerica, Mass.) and SierraTherm (Watsonville, Calif.). Commercial atmospheric pressure CVD equipment for coating glass on the float production line is made in the USA by the Libbey-Owens-Ford Company (Toledo, Ohio), PPG Industries (Pittsburgh, Pa.) and AFG Industries (Kingsport, Tenn.). Low-pressure CVD equipment is made by Applied Materials (Santa Clara, Calif.), Spire Corporation (Bedford, Mass.), Materials Research Corporation (Gilbert, Ariz.) and Novellus (San Jose, Calif.).

The liquid reactants may be vaporized by well-known methods, including passing a carrier gas through a heated liquid or powdered solid in a bubbler, or injecting or spraying a liquid or a solution into a flow of heated carrier gas. Commercial equipment for vaporization of liquids is made by MKS Instruments (Andover, Mass.) and ATM (Danbury, Conn.).

Triethyldialuminum tri-sec-butoxide may be prepared by mixing equimolar amounts of triethylaluminum and aluminum sec-butoxide and heating the mixture to about 180° C. for about 6 hours. By carbon-13 NMR analysis, the resulting reaction product was found to be a mixture containing about 51 mole per cent triethyldialuminum tri-sec-butoxide along with smaller amounts of diethyldialuminum tetra-sec-butoxide (about 20 mole per cent) and tetraethyldialuminum di-sec-butoxide (about 29 mole per cent). The average n for this mixture is 3.09.

A similar mixture of alkylaluminum alkoxides is formed by mixing triethylaluminum in hexane solution with 1.5 equivalents of anhydrous sec-butanol. Ethane gas is immediately evolved, and then the hexane is removed under vacuum and the product heated to about 180° C. for about 6 hours to yield triethyldialuminum tri-sec-butoxide, along with smaller amounts of diethyldialuminum tetra-sec-butoxide and tetraethyldialuminum di-sec-butoxide. Because the volatilities and reactivities of these three alkylaluminum alkoxides are similar, the mixed reaction product may be used as a reactant in CVD processes without further separation or purification. We will refer to this mixture by the name of its major component, triethyldialuminum tri-sec-butoxide. Use of aluminum isopropoxide in place of aluminum sec-butoxide gives a similar mixture which is mainly triethyldialuminum tri-isopropoxide, along with smaller amounts of tetraethyldialuminum di-isopropoxide and diethyldialuminum tetra-isopropoxide. Analogous reactions were found in which trimethylaluminum was used in place of triethylaluminum. Thus, a mixture of alkyldialuminum alkoxides in which the predominant compound has n of about 3, has been shown to provide a nonWO pyrophoric liquid. By "dominant" or "predominant" as those terms are used herein, it is meant comprising $\geq 50\%$ of the liquid.

The triethyldialuminum tri-sec-butoxide mixture is a clear, non-viscous liquid, which may be distilled over a temperature range of about 183–186° C. at a pressure of 40 millibars. The vapor of this liquid may be formed in a thin-film evaporator, or by nebulization into a carrier gas preheated to about 150 to 200° C. The nebulization may be carried out pneumatically or ultrasonically. Alternatively, the triethyldialuminum tri-sec-butoxide may be dissolved in a solvent, such as xylene, and the solution vaporized using a thin film evaporator or nebulization.

The alkylaluminum alkoxide compound may serve as the oxygen source for the resultant oxide film. In some embodiments, it may be preferred to include an additional oxygen-containing gas, such as by way of example only, $O_2$. Because aluminum oxide deposition may occur using oxygen containing gases such as $O_2$, the deposition process is not disrupted by leaks of air into the deposition region.

The invention may be understood with reference to the following examples, which are for the purpose of illustration only and in no way intended to be limiting of the invention, the true scope of which is set forth in the claims which follow.

EXAMPLE 1

Triethyldialuminum tri-sec-butoxide was vaporized by pumping the liquid at a rate of 0.05 milliliters per minute into a flow of 8 liters per minute of dry nitrogen gas preheated to a temperature of 150° C. A separate gas mixture was formed by the flow of 1 liter per minute of dry oxygen and 2 liters per minute of dry nitrogen.

These two vapor mixtures were combined at a tee joint, from which they flowed through a line heated to 150° C. into the entrance to a CVD chamber measuring 10 cm wide by 0.6 cm high by 10 cm long (in the direction of the gas flow). A glass substrate rested on the bottom of the CVD chamber, which is heated from below, so that the glass plate was held at a temperature of about 400° C., while the top plate of the CVD chamber was at about 250° C.

Prior to the deposition and while the glass plate was heating up, dry nitrogen passed through the chamber. Valves then switched on the flows of triethyldialuminum tri-sec-butoxide and oxygen through the chamber for one minute, during which a layer of aluminum oxide was deposited.

On the surface of the glass plate there was a transparent coating of aluminum oxide with a thickness of about 150 nanometers. Its structure is amorphous by X-ray diffraction. The film has a refractive index of about 1.6, a dielectric constant of about 6 to 8, and a very high electrical resistance. The absorption of visible light by the film is less than 0.1 per cent. It is a good barrier to the diffusion of most materials, including sodium ions and water.

EXAMPLE 2

Example 1 was repeated with a liquid mixture containing as its main component triethyldialuminum tri-isopropoxide, in place of the triethyldialuminum tri-sec-butoxide. A similar coating of aluminum oxide was formed.

EXAMPLE 3

Example 1 was repeated with a solution of triethyldialuminum tri-sec-butoxide, 20 per cent by weight in xylene solution, in place of the triethyldialuminum tri-sec-butoxide mixture and the liquid pumping rate was increased to 0.25 milliliters per minute. A similar coating of aluminum oxide was formed.

EXAMPLE 4

Example 1 was repeated, except that the oxygen gas flow is omitted, and the temperature of the glass substrate was raised to 600° C. A similar, but thicker, coating of aluminum oxide was formed.

The liquids and solutions used in these examples all appeared to be nonpyrophoric by the methods published by the United States Department of Transportation. One test call for placing about 5 milliliters of the liquid or solution on an non-flammable porous solid, and observing that no spontaneous combustion occurs. Another test involves dropping 0.5 milliliters of the liquid or solution on a Whatman No. 3 filter paper, and observing that no flame or charring of the paper occurs.

Those skilled in the art will recognize or be able to ascertain using no more than routine experimentation, many equivalents to the specific embodiments of the invention described specifically herein. Such equivalents are intended to be encompassed in the scope of the following claims.

What is claimed is:

1. A process for forming a material comprising aluminum oxide, comprising:

providing a vapor generated from a non-pyrophoric liquid, said liquid comprised of one or more alkylaluminum alkoxide compounds having a composition $R_nAl_2(OR')_{6-n}$, where R and R' are alkyl groups and n is in the range of 1 to 5; and contacting the vapor with a heated surface to deposit an aluminum oxide containing material.

2. A process for forming a material comprising aluminum oxide, comprising:

providing a vapor comprised of one or more alkylaluminum alkoxide compounds having a composition $R_nAl_2(OR')_{6-n}$, where R and R' are alkyl groups and n is less than four; and contacting the vapor with a heated surface to deposit an aluminum oxide-containing material.

3. The process of claim 1, wherein n is less than four.

4. The process of claim 1 or 2, wherein n is about three.

5. The process of claim 1 or 2, in which the vapor further includes a reactive oxygen-containing gas or vapor.

6. The process of claim 5, in which the reactive oxygen-containing gas is oxygen gas.

7. The process of claim 1 or 2, wherein the vapor comprises a predominant amount of an alkylaluminum alkoxide, wherein n is three or less.

8. The process of claim 1 or 2, wherein the vapor comprises a predominant amount of triethyldialuminum tri-sec-butoxide.

9. The process of claim 1 or 2, wherein the vapor comprises a predominant amount of triethyldialuminum tri-isopropoxide.

10. The process of claim 1 or 2, in which the substrate temperature is in the range from 500 to 700° C.

11. The process of claim 6, in which the substrate temperature is in the range from 300 to 500° C.

12. The process of claim 1, wherein the liquid is vaporized by thin film evaporation.

13. The process of claim 1, wherein the liquid is vaporized by nebulization into a carrier gas.

* * * * *

UNITED STATES PATENT AND TRADEMARK OFFICE
CERTIFICATE OF CORRECTION

PATENT NO. 6,037,003
DATED : March 14, 2000
INVENTORS : Roy Gordon, Keith Kramer, and Xinye Liu It is certified that error appears in the above-identified patent and that said Letters Patent is hereby corrected as shown below:

Title page item [56] under "Other Publications":

First reference, third line, please delete "No Month Data!"

Second reference, fourth line, please delete "No Month Data!"

Third reference, third line, please delete "No Month Data!"

Fourth reference, third and fourth lines, please delete "No Month Data!"

Fifth reference, third line, please delete "No Month Data!"

Sixth reference, third line, please delete "No Month Data"

Column 4, line 55, please delete "nonWO pyrophoric" and insert --non pyrophoric--

Signed and Sealed this

Twenty-seventh Day of February, 2001

Attest:

NICHOLAS P. GODICI

Attesting Officer

Acting Director of the United States Patent and Trademark Office